United States Patent
Yamanaka

(10) Patent No.: US 6,678,303 B2
(45) Date of Patent: Jan. 13, 2004

(54) SEMICONDUCTOR LASER DEVICE IN WHICH END OF ELECTRIC-TO-OPTICAL CONVERSION LAYER PROTRUDES OUTWARD FROM SHORTEST CURRENT PATH BETWEEN END FACETS OF CLADDING LAYERS

(75) Inventor: Fusao Yamanaka, Kaisei (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/175,456

(22) Filed: Jun. 20, 2002

(65) Prior Publication Data

US 2002/0196829 A1 Dec. 26, 2002

(30) Foreign Application Priority Data

Jun. 22, 2001 (JP) ........................................ 2001-189574

(51) Int. Cl.⁷ ................................................ H01S 5/00
(52) U.S. Cl. ............................... 372/50; 372/75; 372/43
(58) Field of Search ......................... 372/43–50, 38.01, 372/38.02, 75, 107

(56) References Cited

U.S. PATENT DOCUMENTS

| | | | |
|---|---|---|---|
| 5,144,634 A | | 9/1992 | Gasser et al. |
| 5,311,536 A | * | 5/1994 | Paoli et al. ............... 372/50 |
| 5,553,091 A | * | 9/1996 | Delorme .................. 372/50 |
| 6,261,703 B1 | * | 7/2001 | Sasaki et al. ............ 428/627 |
| 6,359,921 B1 | * | 3/2002 | Yamanaka ................ 372/43 |
| 6,382,800 B2 | * | 5/2002 | Sato ...................... 257/103 |
| 6,516,016 B1 | * | 2/2003 | Fukunaga et al. ........ 372/45 |
| 6,522,676 B1 | * | 2/2003 | Goto et al. .............. 372/43 |
| 2001/0017872 A1 | * | 8/2001 | Yamanaka ................ 372/43 |

FOREIGN PATENT DOCUMENTS

EP     1198042 A2  *  4/2002  ............ H01S/5/16

* cited by examiner

Primary Examiner—Paul Ip
Assistant Examiner—Tuan Nguyen
(74) Attorney, Agent, or Firm—Sughrue Mion, PLLC

(57) ABSTRACT

A semiconductor laser device constituted by a stack of semiconductor layers formed on a substrate. The semiconductor layers include a first cladding layer of a first conductive type, an electric-to-optical conversion layer, and a second cladding layer of a second conductive type, formed in this order. In the semiconductor laser device, resonator surfaces are formed at opposite ends of the stack, and the end facet of the electric-to-optical conversion layer at each of at least one of the opposite ends of the stack protrudes outward from the shortest current path between the end facets of the first cladding layer and the second cladding layer at the end of the stack through semiconductor layers located between the first cladding layer and the second cladding layer.

13 Claims, 7 Drawing Sheets

SEMICONDUCTOR LASER DEVICE IN WHICH END OF ELECTRIC-TO-OPTICAL CONVERSION LAYER PROTRUDES OUTWARD FROM SHORTEST CURRENT PATH BETWEEN END FACETS OF CLADDING LAYERS

BACKGROUND OF THE INVENTION

1. Field of the Invention

The present invention relates to a semiconductor laser device. In particular, the present invention relates to a semiconductor laser device in which provision is made for suppressing degradation of a resonator surface caused by optical damage.

2. Description of the Related Art

One of dominant factors which limit reliability of semiconductor laser devices is degradation caused by non-radiative current which is generated in vicinities of resonator surfaces (end facets) when output power is high. Since the number of energy levels produced by surface defects is great at the end facets of the semiconductor crystal layers which realizes resonator surfaces, non-radiative recombination current increases, bandgaps in the vicinities of the end facets are reduced by heat generation which the non-radiative recombination current produces, and absorption regions with regard to laser light are formed. That is, absorption coefficients in the vicinities of the end facets become great, and light absorption and heat generation are enhanced. Thus, the reliability of the semiconductor laser devices is reduced by the heat generation at the resonator surfaces. The conventional techniques proposed for suppressing the non-radiative recombination current (non-radiative current) which causes the above problem can be roughly classified into two techniques.

The first technique is disclosed in the Japanese Patent Publication No. 58(1983)-05320. According to the first technique, the non-radiative current is suppressed by forming a so-called window structure. That is, in order to prevent light absorption in vicinities of end facets and reduce non-radiative current in a semiconductor laser device, a structure being made of semiconductor materials and realizing a bandgap greater than an oscillation wavelength is formed by changing compositions of the semiconductor materials in the vicinities of the resonator surfaces of the semiconductor laser device.

The second technique is disclosed in the U.S. Pat. No. 5,144,634. According to the second technique, a passivation layer made of, for example, silicon is formed after removal of an oxidation layer on a resonator surface of a semiconductor laser device which is produced by cleavage, in order to passivate dangling bonds in compound semiconductors. In addition, a dielectric layer is formed on the passivation layer. Thus, the number of lattice defects generated at compound semiconductor interfaces and non-radiative current can be reduced. Further, the U.S. Pat. No. 5,144,634 also discloses a technique for preventing generation of the above oxidation layer by forming a protection film immediately after cleavage in a vacuum, instead of removing the oxidation layer.

However, in the case where a window structure is formed as disclosed in Japanese Patent Publication No. 58(1983)-05320, the manufacturing process is complex, and correspondingly complex equipment is required. For example, the manufacturing process includes a mask production process for processing only window regions (vicinities of resonator surfaces), an ion injection process for injecting ions, e.g., silicon ions, and an annealing process for realizing thermal diffusion after the ion injection.

On the other hand, in the case where a passivation layer is formed as disclosed in the U.S. Pat. No. 5,144,634, it is necessary to realize at first a state in which no oxidation layer remains on the resonator surface. In order to realize such a state, the oxidation layer on the resonator surface is removed by using a dedicated ion gun. Thereafter, the passivation layer is formed. However, an ultra-high vacuum system is necessary for preventing oxidation of semiconductor surfaces after the removal of the oxidation layer until the formation of the passivation layer, and therefore the vacuum system per se becomes large and expensive.

In the case where the cleavage is performed in a vacuum, the process for removing the oxidation layer can be dispensed with. However, in order to perform cleavage in a vacuum, an apparatus for conveying, cleaving, and coating a wafer in a vacuum is necessary. In addition, in order to adapt such an apparatus for mass production, the construction of the apparatus becomes further complex. Nevertheless, a simple internal structure is required for maintaining an ultra-high vacuum. That is, the complex construction of the apparatus for performing the various processing in a vacuum does not satisfy the requirement for maintaining the ultra-high vacuum.

SUMMARY OF THE INVENTION

The object of the present invention is to provide a semiconductor laser device in which non-radiative current generated in a vicinity of a resonator surface is surely reduced, and which is highly reliable and easy to produce.

According to the present invention, there is provided a semiconductor laser device comprising a stack of a plurality of semiconductor layers which include: a substrate; a first cladding layer of a first conductive type, formed above the substrate; an electric-to-optical conversion layer formed above the first cladding layer; and a second cladding layer of a second conductive type, formed above the electric-to-optical conversion layer. In the semiconductor laser device, resonator surfaces are formed at opposite ends of the stack, and an end facet of the electric-to-optical conversion layer at each of at least one of the opposite ends of the stack protrudes outward from the shortest current path between end facets of the first cladding layer and the second cladding layer at the end of the stack through semiconductor layers located between the first cladding layer and the second cladding layer.

In the above construction, carriers flow from the cladding layers into an inside region of the electric-to-optical conversion layer instead of the vicinity of an end facet of the electric-to-optical conversion layer. Therefore, non-radiative current flowing in the vicinity of the end facet can be effectively suppressed, and thus it is possible to prevent degradation of the end facet and achieve high reliability. In addition, the process for forming the resonator surfaces is easier than the processes for producing the conventional semiconductor laser devices in which the aforementioned provision for preventing degradation of end facets is made. Therefore, the manufacturing cost can be reduced by the present invention.

Preferably, the semiconductor laser device according to the present invention may also have one or any possible combination of the following additional features (i) to (xi).

(i) The semiconductor laser device according to the present invention may further comprise at least one protection film with which at least one of the resonator surfaces at the at least one of the opposite ends of the stack is coated. The at least one protection film has a function of controlling the reflectance at the at least one of the resonator surfaces.

(ii) The plurality of semiconductor layers may further include: a first optical waveguide layer formed between the first cladding layer and the electric-to-optical conversion layer; a second optical waveguide layer formed between the second cladding layer and the electric-to-optical conversion layer; and a contact layer formed above the second cladding layer.

(iii) The end of the electric-to-optical conversion layer may protrude outward from the ends of the first optical waveguide layer and the second optical waveguide layer, at the end of the stack.

(iv) In the semiconductor laser device according to the present invention having the additional feature (iii), the end of the electric-to-optical conversion layer and the ends of the first and second optical waveguide layers may protrude outward from the ends of the first cladding layer and the second cladding layer, at the end of the stack.

(v) In the semiconductor laser device according to the present invention having the additional feature (ii), the plurality of semiconductor layers may further include: a first barrier layer formed between the first optical waveguide layer and the electric-to-optical conversion layer; and a second barrier layer formed between the second optical waveguide layer and the electric-to-optical conversion layer.

(vi) In the semiconductor laser device according to the present invention having the additional feature (v), the end of the electric-to-optical conversion layer may protrude outward from the ends of the first and second barrier layers, at the end of the stack.

(vii) In the semiconductor laser device according to the present invention having the additional feature (v), the end of the electric-to-optical conversion layer and the ends of the first and second barrier layers may protrude outward from the ends of the first and second optical waveguide layers, at the end of the stack.

(viii) In the semiconductor laser device according to the present invention having the additional feature (v), the end of the electric-to-optical conversion layer, the ends of the first and second barrier layers, and the ends of the first and second optical waveguide layers may protrude outward from the ends of the first cladding layer and the second cladding layer, at the end of the stack.

(ix) In the semiconductor laser device according to the present invention having the additional feature (ii), the end of the electric-to-optical conversion layer may protrude outward from the end of one of the first cladding layer and the second cladding layer at the end of the stack, and may be recessed from the end of the other of the first cladding layer and the second cladding layer, at the end of the stack.

(x) In the semiconductor laser device according to the present invention having the additional feature (i), at least one first semiconductor layer out of the plurality of semiconductor layers has an end recessed from the end of the electric-to-optical conversion layer at the end of the stack, at least one second semiconductor layer out of the at least one first semiconductor layer is located nearest to the electric-to-optical conversion layer among the at least one first semiconductor layer, and one of the at least one second semiconductor layer has an end recessed from the end of the electric-to-optical conversion layer by the smallest amount of recession among the at least one second semiconductor layer. At this time, the smallest amount of recession may satisfy a condition $a \leq \Delta D \leq \delta$, where a is a lattice constant of the electric-to-optical conversion layer, $\delta$ is a thickness of one of the at least one protection film at the end of the stack, and $\Delta D$ is the smallest amount of recession.

In the case where more than one first semiconductor layer out of the plurality of semiconductor layers has an end recessed from the end of the electric-to-optical conversion layer at the end of the stack, and two second semiconductor layers out of the more than one first semiconductor layer are located nearest to the electric-to-optical conversion layer among the more than one first semiconductor layer, and the amounts of recession of the two second semiconductor layers are different, one of the two second semiconductor layers which has an end facet recessed from the end facet of the electric-to-optical conversion layer by the smaller amounts of recession is the one of the at least one second semiconductor layer.

In the case where the amounts of recession of the above two second semiconductor layers are identical, either of the two second semiconductor layers can be the one of the at least one second semiconductor layer.

On the other hand, in the case where only one semiconductor layer out of at least one semiconductor layer which has an end recessed from the end of the electric-to-optical conversion layer at the end of the stack is located nearest to the electric-to-optical conversion layer, the only one semiconductor layer is the one of the at least one second semiconductor layer.

(xi) In the semiconductor laser device according to the present invention having the additional feature (x), when the at least one first semiconductor layer includes more than one semiconductor layer, and two semiconductor layers out of the more than one semiconductor layer are located nearest to the electric-to-optical conversion layer among the more than one semiconductor layer, and one of the two semiconductor layers has an end recessed from the end of the electric-to-optical conversion layer by a larger amount of recession between the two semiconductor layers, the larger amount of recession may satisfy a condition $a \leq \Delta D \leq \delta/k$, where $k = \Delta d / \Delta D$, and $\Delta d$ is the larger amount of recession.

When the above two semiconductor layers have an end recessed from the end of the electric-to-optical conversion layer by an identical amount of recession, $\Delta d = \Delta D$ and therefore $k=1$.

When the above condition (x) or both of the conditions (x) and (xi) are satisfied, the non-radiative current flowing through the vicinities of the end facets can be further effectively suppressed or shut off, and a sufficient effect of end facet protection can be obtained. Thus, the reliability of the semiconductor laser device according to the present invention can be further increased.

DESCRIPTION OF PREFERRED EMBODIMENTS

Embodiments of the present invention are explained in detail below with reference to drawings.

First Embodiment

Figure 1:
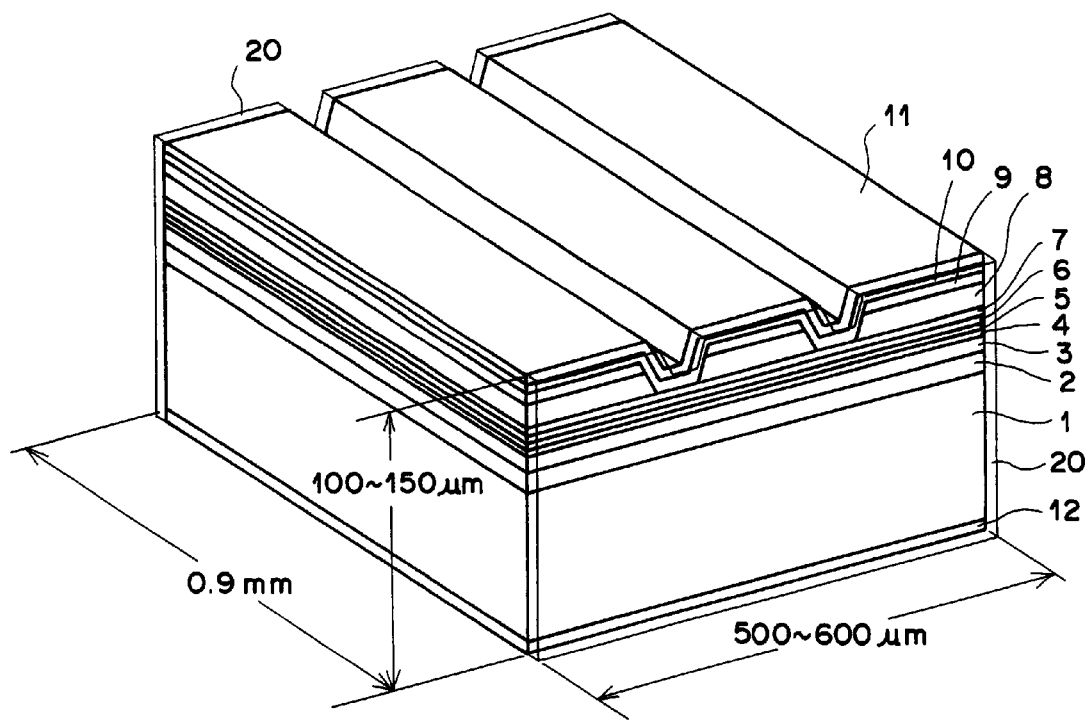
FIG. 1 is a perspective view of a semiconductor laser device as a first embodiment of the present invention.

FIG. 1 is a perspective view of a semiconductor laser device as the first embodiment of the present invention. The semiconductor laser device as the first embodiment is an edge-emitting semiconductor laser device which comprises a first cladding layer 2 of a first conductive type, a first optical waveguide layer 3 of the first conductive type or an intrinsic type (i-type), a first barrier layer 4 of an intrinsic type, a quantum-well electric-to-optical conversion layer 5 of an intrinsic type, a second barrier layer 6 of an intrinsic type, a second optical waveguide layer 7 of a second conductive type or an intrinsic type, a second cladding layer 8 of the second conductive type, and a contact layer 9 of the second conductive type, formed in this order on a substrate 1 of the first conductive type. In addition, opposite side surfaces, perpendicular to the thickness direction, of the above semiconductor layers are formed as resonator surfaces. Further, protection films 20 are formed on the resonator surfaces for protection and reflectance control.

The first conductive type is different in the polarity of carriers from the second conductive type. For example, when the first conductive type is an n type, and the second conductive type is a p type.

The end of the electric-to-optical conversion layer 5 at each of at least one of the opposite ends (resonator surfaces) of the above semiconductor layers protrudes outward from the shortest current path between the end facets of the first cladding layer 2 and the second cladding layer 8 at the end through the semiconductor layers located between the first cladding layer 2 and the second cladding layer 8.

FIGS. 2A to 2I are local sectional views illustrating concrete examples of edge structures of the semiconductor laser device. In FIGS. 2A to 2I, layers having each function are hatched or not hatched in an identical manner, and the shortest current path in each of the concrete examples of the edge structure is indicated with a two-side arrowed, dashed line. It is preferable that the semiconductor laser device according to the present invention has the edge structure illustrated in one of FIGS. 2A to 2I at each of the opposite ends at which the resonator surfaces are formed.

In the edge structures illustrated in FIGS. 2A to 2E, the end of the electric-to-optical conversion layer 5 protrudes outward from the ends of the first and second barrier layers 4 and 6.

Figure 2A:
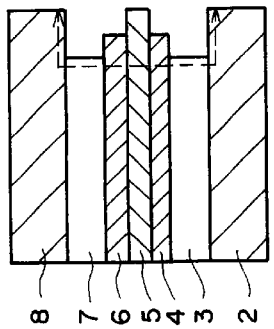
FIG. 2A is a local sectional view illustrating a first example of an edge structure of a semiconductor laser device.
Figure 2B:
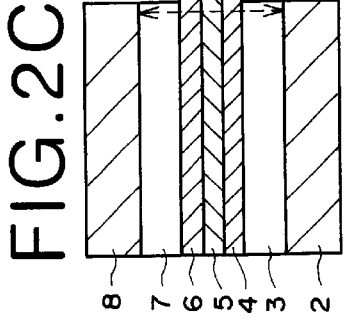
FIG. 2B is a local sectional view illustrating a second example of an edge structure of a semiconductor laser device.
Figure 2C:
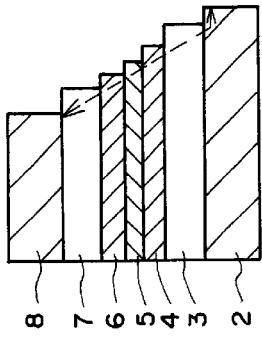
FIG. 2C is a local sectional view illustrating a third example of an edge structure of a semiconductor laser device.
Figure 2D:
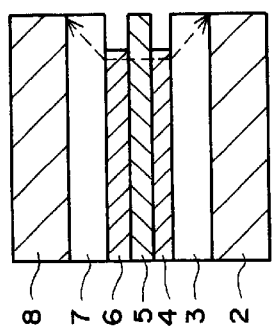
FIG. 2D is a local sectional view illustrating a fourth example of an edge structure of a semiconductor laser device.
Figure 2E:
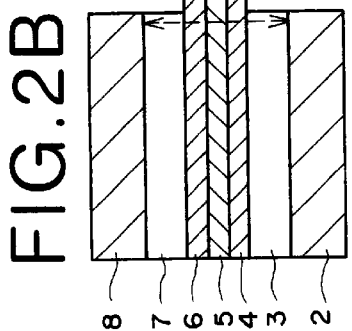
FIG. 2E is a local sectional view illustrating a fifth example of an edge structure of a semiconductor laser device.
Figure 2F:
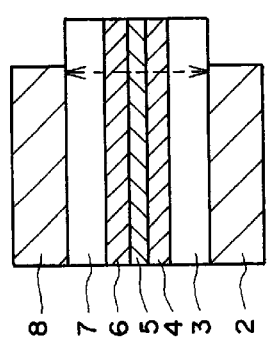
FIG. 2F is a local sectional view illustrating a sixth example of an edge structure of a semiconductor laser device.
Figure 2G:
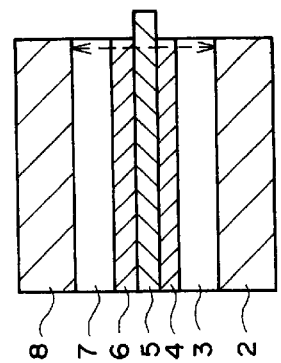
FIG. 2G is a local sectional view illustrating a seventh example of an edge structure of a semiconductor laser device.

In the edge structures illustrated in FIGS. 2F and 2G, the end of the electric-to-optical conversion layer 5 and the ends of the first and second barrier layers 4 and 6 protrude outward from the ends of the first and second optical waveguide layers 3 and 7.

Figure 2H:
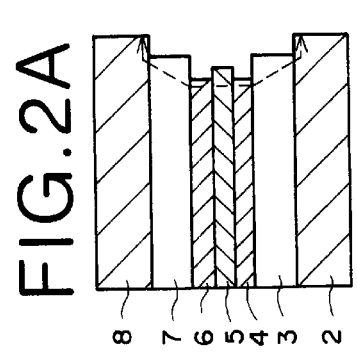
FIG. 2H is a local sectional view illustrating an eighth example of an edge structure of a semiconductor laser device.

In the edge structures illustrated in FIG. 2H, the end of the electric-to-optical conversion layer 5, the ends of the first and second barrier layers 4 and 6, and the ends of the first and second optical waveguide layers 3 and 7 protrude outward from the ends of the first cladding layer 2 and the second cladding layer 8.

Figure 2I:
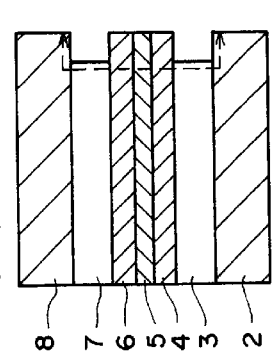
FIG. 2I is a local sectional view illustrating a ninth example of an edge structure of a semiconductor laser device.

In the edge structures illustrated in FIG. 2I, the ends of the respective semiconductor layers are arranged stepwise, and the end of the electric-to-optical conversion layer 5 protrudes outward from the end of the second cladding layer 8, and is recessed from the end of the first cladding layer 2.

Figure 7:
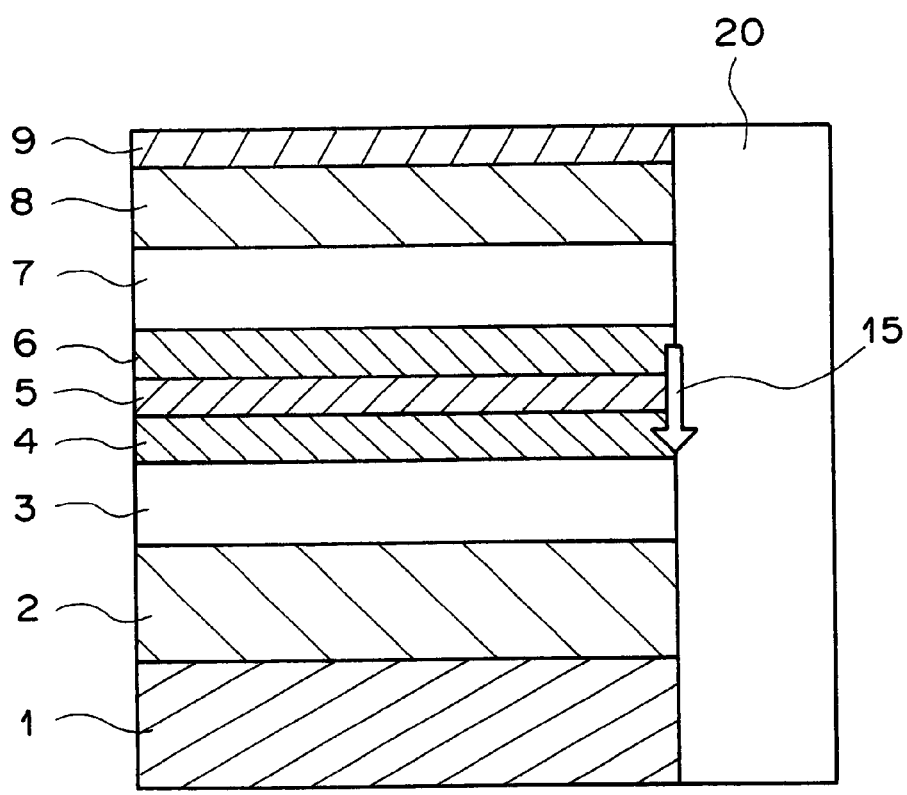
FIG. 7 is a local sectional view illustrating an edge structure of a conventional semiconductor laser device.

An edge structure of a conventional semiconductor laser device is illustrated in FIG. 7. For the purpose of comparison, the semiconductor layers in FIG. 7 having substantially the same functions as the corresponding semiconductor layers in FIGS. 1 to 4 except for their end portions bear the same reference numerals as FIGS. 1 to 4. As illustrated in FIG. 7, in the conventional semiconductor laser device, the end facets of all of the semiconductor layers are aligned within a plane at each end. As explained before, non-radiative current 15 caused by non-radiative recombination of carriers flows along each resonator surface of the semiconductor laser element, in particular, along each end facet of the electric-to-optical conversion layer. Therefore, Joule heat is generated, and the bandgap in the vicinity of the end facet is reduced. Thus, light absorption in the vicinity of the end facet increases, and degradation of the vicinity of the end facet occurs. In order to reduce the end facet degradation, the protection film 20 is formed on the end facet. However, the effect of reducing the non-radiative current 15 flowing along the interface between the semiconductor layers and the protection film 20, in particular, along the end facet of the electric-to-optical conversion layer, is small.

On the other hand, in the edge structures illustrated in FIGS. 2A to 2I, the ends of the semiconductor layers are differently protruded or recessed, and therefore flow of the non-radiative current along the end facet of the electric-to-optical conversion layer 5 can be prevented or suppressed. Although the protection film is not shown in FIGS. 2A to 2I, the current flowing in the vicinities of the interface between the protection film and the semiconductor layers flows into an inside region of the electric-to-optical conversion layer 5 instead of directly flowing into the vicinity of the end facet of the electric-to-optical conversion layer 5. Therefore, it is possible to reduce the non-radiative current at the end facet of the electric-to-optical conversion layer 5.

For example, since the end of the electric-to-optical conversion layer 5 protrudes outward from the ends of the barrier layers in the cases of FIGS. 2A to 2E, currents flowing in the vicinities of the end facets of the barrier layers necessarily flow into the inside regions of the electric-to-optical conversion layer 5, and therefore it is possible to effectively suppress flow of the non-radiative current in the vicinity of the electric-to-optical conversion layer 5.

Figure 3:
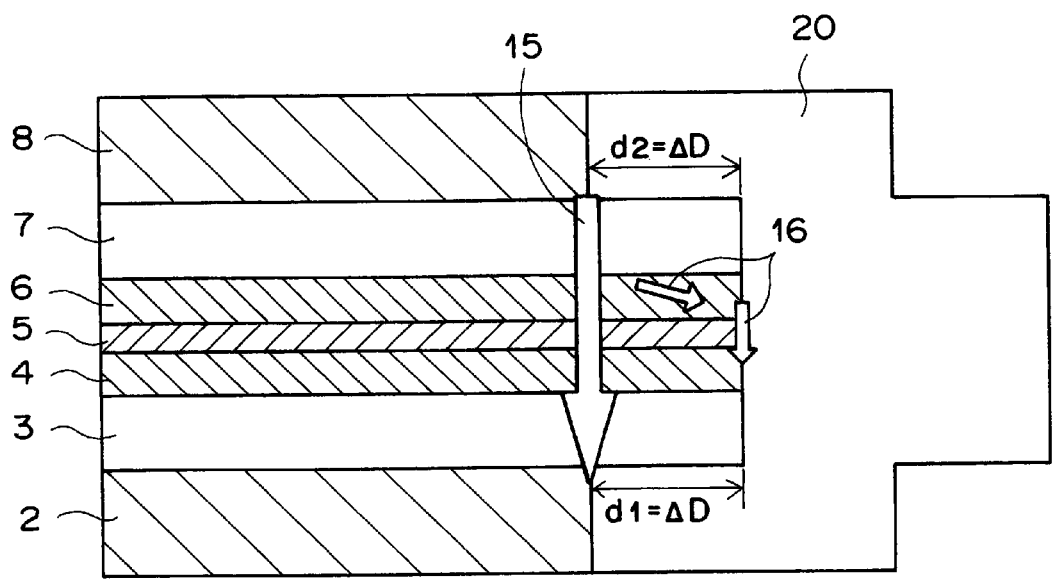
FIG. 3 is a local sectional view indicating dimensions of and current paths in an example of an edge structure of a semiconductor laser device.

In the case of FIG. 2H, the ends of the semiconductor layers from the first optical waveguide layer 3 to the second optical waveguide layer 7 including the quantum-well electric-to-optical conversion layer 5 protrude outward from the ends of the first cladding layer 2 and the second cladding layer 8. As illustrated in FIG. 3, current 16 caused by natural diffusion flows in the optical waveguide layers toward the end facets. Therefore, the non-radiative current flowing in the vicinity of the end facet of the electric-to-optical conversion layer 5 in the edge structure of FIG. 2H is greater than that in the edge structure of FIG. 2A. However, the non-radiative current flowing in the vicinity of the end facet of the electric-to-optical conversion layer 5 in the edge structure of FIG. 2H is much smaller than the non-radiative current flowing in the vicinity of the end facet of the electric-to-optical conversion layer in the conventional edge structure in which all of the end facets of the semiconductor layers are aligned within a plane as illustrated in FIG. 7.

As illustrated in FIGS. 2A to 2I, in the edge structure of the semiconductor laser device as the first embodiment of the present invention, at least one first semiconductor layer out of the plurality of semiconductor layers has an end recessed from the end of the electric-to-optical conversion layer 5 at the end of the stack, at least one second semiconductor layer out of the at least one first semiconductor layer is located nearest to the electric-to-optical conversion layer 5 among the at least one first semiconductor layer, and one of the at least one second semiconductor layer has an end recessed from the end of the electric-to-optical conversion layer 5 by the smallest amount of recession among the at least one second semiconductor layer. At this time, the smallest amount of recession satisfies a condition $a \leq \Delta D \leq \delta$, where a is the lattice constant of the electric-to-optical conversion layer 5, $\delta$ is the thickness of the protection film, and $\Delta D$ is the smallest amount of recession.

In addition, when the at least one first semiconductor layer includes more than one semiconductor layer, and two semiconductor layers out of the more than one semiconductor layer are located nearest to the electric-to-optical conversion layer 5 among the more than one semiconductor layer, and one of the two semiconductor layers has an end recessed from the end of the electric-to-optical conversion layer 5 by a larger amount of recession between the two semiconductor layers, the larger amount of recession satisfies a condition $a \leq \Delta D \leq \delta/k$, where $k = \Delta d/\Delta D$, and $\Delta d$ is the larger amount of recession.

Figure 4:
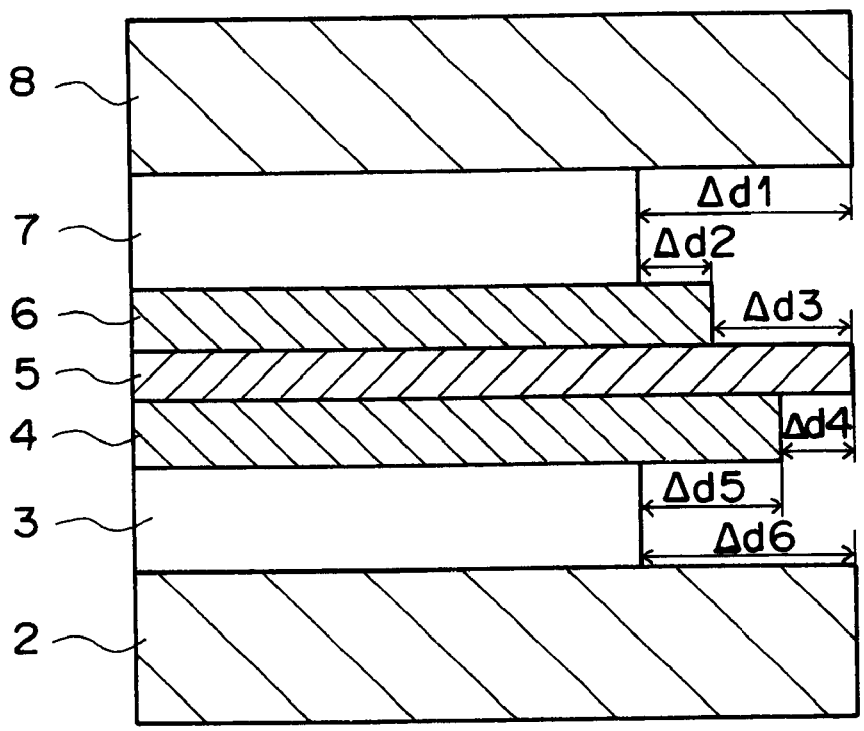
FIG. 4 is a local sectional view indicating dimensions of another example of an edge structure of a semiconductor laser device.

For example, in the case where the ends of the semiconductor layers are differently protruded or recessed as illustrated in FIG. 4, the first barrier layer 4 and the second barrier layer 6, which are adjacent to the quantum-well electric-to-optical conversion layer 5, correspond to the at least one second semiconductor layer located nearest to the electric-to-optical conversion layer 5. In FIG. 4, the amount of recession of the end facet of the first barrier layer 4 from the end facet of the quantum-well electric-to-optical conversion layer 5 is denoted by $\Delta d\ 4$, and the amount of recession of the end facet of the second barrier layer 6 from the end facet of the quantum-well electric-to-optical conversion layer 5 is denoted by $\Delta d\ 3$. Since $\Delta d\ 3 > \Delta d\ 4$ in the example of FIG. 4, $\Delta D = \Delta d\ 4$ and $\Delta d\ 3 = k\Delta D$, where $k > 1$. If the amount $\Delta D$ is too small, the effect of reducing or shutting off the non-radiative current flowing in the vicinity of the end facet of the quantum-well electric-to-optical conversion layer 5 is insufficient. On the other hand, if the amount $\Delta D$ is too great, it is impossible to uniformly form the protection film after the edge structure of the semiconductor layers is formed. In particular, if the amount $\Delta D$ is smaller than the lattice constant a of the electric-to-optical conversion layer, the carriers flowing in the vicinity of the end facets of the semiconductor layers are likely to naturally diffuse to the end facet of the light emitting layer, and therefore the effect of the different amounts of protrusion or recession of the ends of the semiconductor layers does not become manifest. In addition, if the amount $\Delta D$ is greater than $\delta/k$, the recessed end facet is not sufficiently covered by the protection film, and therefore defects which promote generation of non-radiative current are likely to be produced. Further, since portions of the end facets which are not covered by the protection film are exposed to atmosphere, oxidation occurs and degrades the semiconductor laser device. In many cases, the thicknesses of protection films do not exceed $\lambda/2n$, where $\lambda$ is a laser oscillation wavelength, and n is a refractive index of the protection film at the laser oscillation wavelength. Therefore, the amount of recession must not exceed the thickness of the protection film.

Second Embodiment

It is possible to produce a semiconductor laser device which does not include the first barrier layer 4 and the second barrier layer 6 in the semiconductor laser device as the first embodiment.

Figure 5:
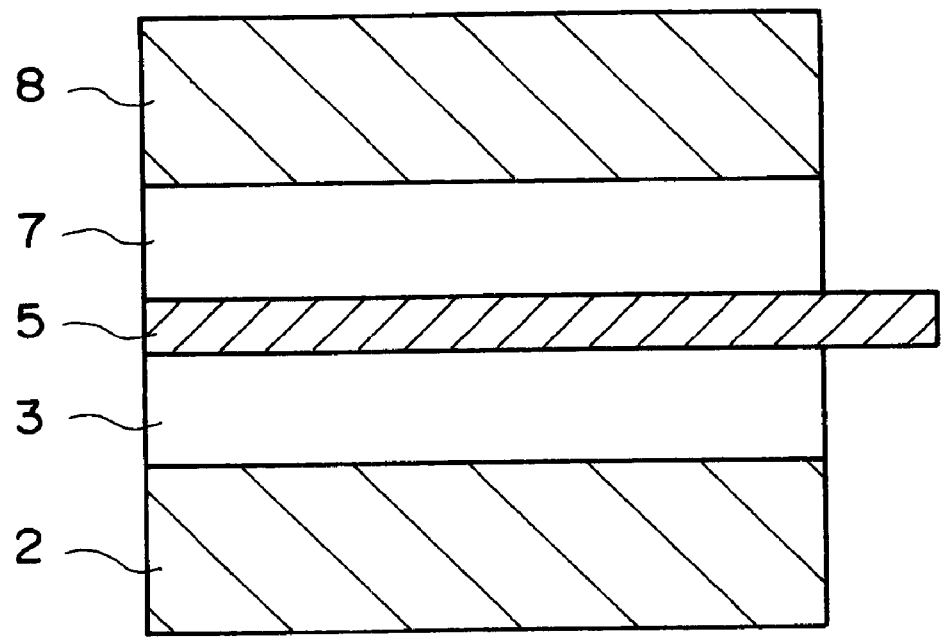
FIG. 5 is a local sectional view illustrating a semiconductor laser device as a second embodiment of the present invention.

FIG. 5 is a local sectional view illustrating a semiconductor laser device as the second embodiment of the present invention. The semiconductor layers in the structure of FIG. 5 which bear the same reference numerals as FIGS. 1 to 4 have substantially the same functions as the corresponding semiconductor layers in FIGS. 1 to 4. In the structure of FIG. 5, the quantum-well electric-to-optical conversion layer 5 is directly sandwiched with the first optical waveguide layer 3 and the second optical waveguide layer 7. In the second embodiment, a similar effect to the first embodiment can be achieved by arranging the semiconductor layers so that the end of the electric-to-optical conversion layer 5 protrudes outward from the ends of the first optical waveguide layer 3 and the second optical waveguide layer 7, or the ends of the electric-to-optical conversion layer 5 and the ends of the first optical waveguide layer 3 and the second optical waveguide layer 7 protrude outward from the ends of the first cladding layer 2 and the second cladding layer 8.

Materials

Typically, the edge structures according to the present invention can be formed in semiconductor laser devices made of InGaN-based, ZnSSe-based, InGaAlP-based, AlGaAs-based, InGaAsP-based, InGaAs-based, InGaSb-based compounds, and the like, where the oscillation wavelengths of the InGaN-based compound semiconductor laser devices are in the range between 360 to 500 nm, the oscillation wavelengths of the ZnSSe-based compound semiconductor laser devices are in the range between 410 to 540 nm, the oscillation wavelengths of the InGaAlP-based compound semiconductor laser devices are in the range between 600 to 730 nm, the oscillation wavelengths of the AlGaAs-based compound semiconductor laser devices are in the range between 750 to 870 nm, the oscillation wavelengths of the InGaAsP-based compound semiconductor laser devices are in the ranges between 700 to 1,200 nm and 1,300 to 1,900 nm, the oscillation wavelengths of the InGaAs-based compound semiconductor laser devices are in the ranges between 950 to 1,200 nm and 1,300 to 1,900 nm, and the oscillation wavelengths of the InGaSb-based compound semiconductor laser devices are in the range between 1,800 to 3,000 nm.

Organic EL Laser Device

A laser structure can be formed in an element using an organic electro-luminescence (EL) material. In this case, it is possible to prevent degradation of the element and increase reliability of the element by recessing ends (at at least one resonator surface) of layers constituting the laser element in a similar manner to the above semiconductor laser devices so that non-radiative current in a vicinity of an end facet of an electric-to-optical conversion layer is reduced. Incidentally, in the laser element using an organic electro-luminescence (EL) material, a carrier transport layer (optical waveguide layer) may have the function of the electric-to-optical conversion layer.

CONCRETE EXAMPLE I

In the concrete example I, the semiconductor laser device of FIG. 1 is produced as explained below. That is, an n-type InGaP first cladding layer 2, an n-type or i-type (intrinsic) $In_{x1}Ga_{1-x1}As_{1-y1}P_{y1}$ first optical waveguide layer 3 ($0 \leq x1 \leq 0.49$, $y1 = x1/0.49 \pm 0.01$), an i-type $In_{x2}Ga_{1-x2}As_{1-y2}P_{y2}$ first barrier layer 4 ($x2/0.49 \pm 0.01 < y2 \leq 0.3 + (x2/0.49) \pm 0.01$), an i-type $In_{x3}Ga_{1-x3}As_{1-y3}P_{y3}$ quantum-well electric-to-optical conversion layer 5 ($0 \leq x3 < 0.5$, $0 \leq y3 < 0.5$), an i-type $In_{x2}Ga_{1-x2}As_{1-y2}P_{y2}$ second barrier layer 6, a p-type or i-type $In_{x1}Ga_{1-x1}As_{1-y1}P_{y1}$ second optical waveguide layer 7, a p-type InGaP second cladding layer 8, and a p-type GaAs contact layer 9 are formed on an n-type GaAs substrate 1 by organometallic vapor phase epitaxy. The compositions of the first cladding layer 2, the second cladding layer 8, the first optical waveguide layer 3, and the second optical waveguide layer 7 are determined so as to lattice-match with the GaAs substrate 1. In addition, although not shown, the p-type InGaP second cladding layer 8 includes at its mid-thickness a p-type InGaP etching stop layer having a thickness of about 10 nm.

The wavelength $\lambda$ of light emitted from the semiconductor laser device as the concrete example I can be controlled in the range between 750 and 1,100 nm by appropriately adjusting the composition of the $In_{x3}Ga_{1-x3}As_{1-y3}P_{y3}$ quantum-well electric-to-optical conversion layer 5. For example, the present inventor has obtained an oscillation wavelength of 1,060 nm by forming the first and second cladding layers 2 and 8 of $In_{0.49}Ga_{0.51}P$, the first and second optical waveguide layers 3 and 7 of $In_{0.2}Ga_{0.8}As_{0.6}P_{0.4}$, the first and second barrier layers 4 and 6 of $GaAs_{0.8}P_{0.2}$, and the quantum-well electric-to-optical conversion layer 5 of $In_{0.3}Ga_{0.7}As$.

Each layer in the above structure may be formed by molecular beam epitaxy using solid or gas raw material.

After the semiconductor layers 2 to 9 are formed on the substrate 1, a ridge stripe structure having a width of 50 micrometers is formed as follows. First, a first insulation film (not shown) is formed over the layered structures formed as above. Then, two stripe areas of the first insulation film being located on both sides of the ridge stripe structure and each having a width of 10 micrometers are removed by conventional lithography, and portions of the above layered structure under the two stripe areas are removed to the depth of the upper boundary of the p-type InGaP etching stop layer by wet etching using the remaining portions of the first insulation film as a mask and a solution of sulfuric acid and hydrogen peroxide as an etchant. Due to the use of the solution of sulfuric acid and hydrogen peroxide as an etchant, the wet etching automatically stops at the upper boundary of the p-type InGaP etching stop layer.

Next, the remaining portions of the first insulation film are removed, and then a second insulation film 10 is formed over the entire surface of the layered structure processed as above. Thereafter, a portion of the second insulation film 10 located on the top of the ridge stripe structure is removed so as to expose a stripe area of the GaAs contact layer 9. Then, a p electrode 11 is formed over the entire surface of the exposed stripe area of the GaAs contact layer 9, and the p electrode 11 is coated with Au plating (not shown) having a thickness of 5 micrometers or more. Finally, the bottom surface of the n-type GaAs substrate 1 is polished so as to reduce the thickness of the semiconductor laser element to 100 to 150 micrometers, and an n electrode 12 is formed on the polished surface.

In practice, a plurality of layered structures each corresponding to a semiconductor laser element are concurrently formed on a substrate having a form of a wafer. After the above semiconductor layers and electrodes are formed on the wafer, the wafer is cleaved in air into a plurality of bars each having a length of 10 to 20 mm and a width corresponding to a resonator length of 0.9 mm, where the wafer is cleaved in such a direction that (110) faces are exposed as light exit end facets.

Then, each bar is fixed to a jig designed for etching the light exit end facets, and set in an ECR (electron cyclotron resonance) etching system for processing the light exit end facets. The etching is performed by using argon (Ar) and appropriately adjusting gas pressure. If the gas pressure is too high, the anisotropic etching rate becomes too small. If the gas pressure is too low, the plasma and the etching rate become unstable. Generally, the appropriate gas pressure for the etching is from $3 \times 10^{-1}$ to $1 \times 10^{-2}$ Pa.

In the concrete example I, the edge structure as illustrated in FIG. 3 is formed at each resonator surface. That is, the end of the electric-to-optical conversion layer 5, the ends of the first and second barrier layers 4 and 6, and the ends of the first and second optical waveguide layers 3 and 7 protrude outward from the ends of the first cladding layer 2 and the second cladding layer 8.

The amount $\Delta D$ is controlled by the etching time so as to be smaller than a smaller thickness of protection films (specifically, films for protection and reflectance control) formed on both ends of each semiconductor laser element.

After the etching is completed, the bar is set in a sputtering system in order to form protection films of dielectric materials for protection and reflectance control. On the light exit end facets, an $Al_2O_3$ film 20 having a thickness corresponding to $\lambda/2n$ is formed as the film for protection and reflectance control, where $\lambda$ is the oscillation wavelength and n is the refractive index of the film. In this example, $\lambda$ is 1,060 nm, and the refractive index of $Al_2O_3$ is 1.67. Therefore, the thickness of the $Al_2O_3$ film is 317.4 nm. Thus, the reflectance of the forward end facet becomes 32%. On the opposite end facet, a lamination structure of oxides having a thickness corresponding to $\lambda/4n$ is formed as a film for protection and reflectance control so that the reflectance of the backward end facet becomes 95% or greater. For example, the lamination structure of oxides is made of $Al_2O_3/TiO_2/SiO_2/TiO_2/SiO_2/TiO_2/SiO_2/TiO_2/SiO_2/TiO_2$.

After the above dielectric films are formed on the forward and backward surfaces of the bar corresponding to the end facets of the semiconductor laser elements, the bar is cleaved into the separate semiconductor laser elements (as illustrated in FIG. 1) each having a width of 500 to 600 micrometers.

As a heatsink, Ni is plated on copper to a thickness of 5 micrometers, and then layers of Ni (50 to 150 nm), Pt (50 to 200 nm), and In (3.5 to 5.5 micrometers) are formed in this order on the Ni plated copper by evaporation. Generally, the area of each of the evaporated metal layers is four times the area of each semiconductor laser element or greater. The p side of the semiconductor light element is bonded to the heatsink by heating the heatsink to the temperature range from 180 to 220° C. so as to melt the In layer.

The present inventor has obtained a relationship between the etching condition (etching time) and the amount $\Delta D$ in semiconductor laser elements having the edge structure of FIG. 3 by producing a plurality of semiconductor laser elements having the edge structure of FIG. 3 under different conditions (times) of etching of the ends of semiconductor layers, and measuring the amounts $\Delta D$ by a transmission electron microscope (TEM) or atomic force microscope (AFM). In the semiconductor laser elements having the edge structure of FIG. 3, the end facet of the first cladding layer 2 is recessed from the end facet of the first optical waveguide layer 3 by the amount $\Delta d\,1$, and the end facet of the second cladding layer 8 is recessed from the end facet of the second optical waveguide layer 7 by the amount $\Delta d\,2$. In addition, the first cladding layer 2 and the second cladding layer 8 are located at an equal distance from the quantum-well electric-to-optical conversion layer 5, and $\Delta d\,1 = \Delta d\,2 = \Delta D$ (i.e., k=1).

Thereafter, the present inventor has produced a plurality of semiconductor laser elements having the edge structure of FIG. 3 with different values of $\Delta D$ under different production conditions obtained based on the relationship between the etching condition (etching time) and the amount $\Delta D$, and performed a reliability test of each of the plurality of semiconductor laser elements. Specifically, the reliability test is performed on seven or eight semiconductor laser elements produced under each condition which has been confirmed to correspond to each value of $\Delta D$. In the reliability test, a continuous lighting time (lifetime) of each semiconductor laser element with the output power of 450 mWapc at the driving circumstance temperature of 60° C. is measured. The result is indicated in FIG. 6.

Figure 6:
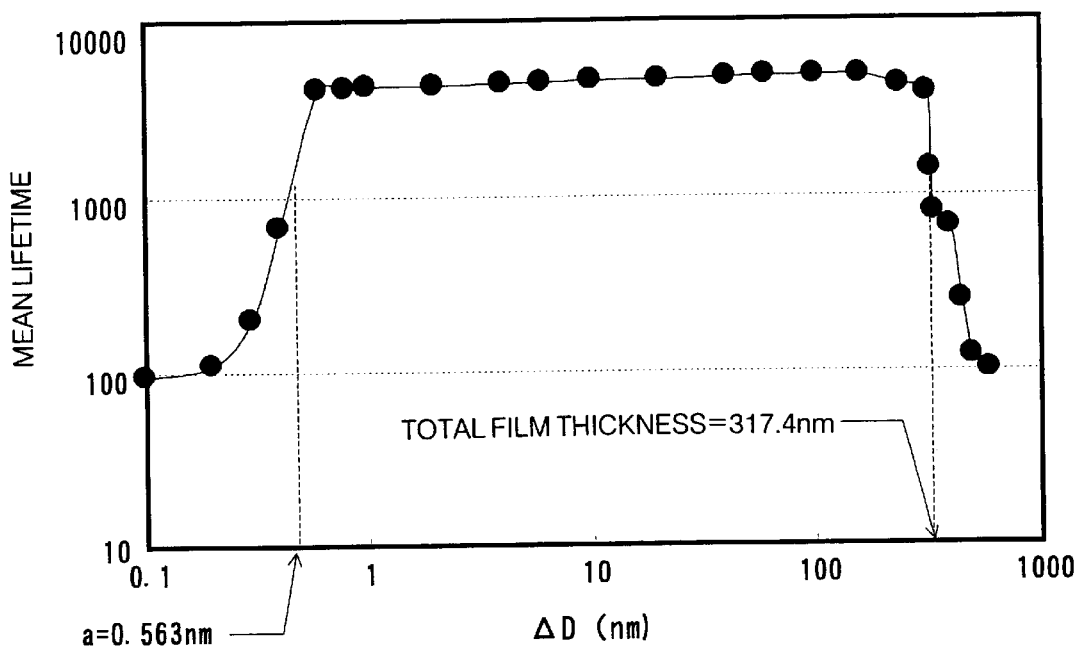
FIG. 6 is a graph indicating a relationship between the amount ΔD of recession and the reliability of a semiconductor laser device.

In FIG. 6, the measured mean lifetime of the semiconductor laser elements (the median value of the measured lifetimes of the seven or eight semiconductor laser elements) corresponding to each value of $\Delta D$ is indicated by a graph. The graph of FIG. 6 clearly indicates that the reliability of the semiconductor laser elements is enhanced when the amount $\Delta D$ of recession satisfies the condition, $a \leq \Delta D \leq 317.4$ nm (=the total thickness of the $Al_2O_3$ film). The lifetime decreases when the amount $\Delta D$ of recession exceeds the total thickness of the $Al_2O_3$ film. It is considered that the end facet recessed by the amount $\Delta D$ which is greater than the total thickness of the $Al_2O_3$ film cannot be sufficiently covered by the $Al_2O_3$ film, and causes degradation of the semiconductor laser elements by oxidation during the aging reliability test.

CONCRETE EXAMPLE II

In the concrete example II, the semiconductor laser device of FIG. 1 is produced as explained below. That is, an n-type $Ga_{1-z1}Al_{z1}As$ first cladding layer 2, an n-type or i-type $In_{x1}Ga_{1-x1}As_{1-y1}P_{y1}$ first optical waveguide layer 3, an i-type $In_{x2}Ga_{1-x2}As_{1-y2}P_{y2}$ first tensile-strain barrier layer 4, an $In_{x3}Ga_{1-x3}As_{1-y3}P_{y3}$ quantum-well electric-to-optical conversion layer 5, an i-type $In_{x2}Ga_{1-x2}As_{1-y2}P_{y2}$ second tensile-strain barrier layer 6, a p-type or i-type $In_{x1}Ga_{1-x1}As_{1-y1}P_{y1}$ second optical waveguide layer 7, a p-type $Ga_{1-z1}Al_{z1}As$ second cladding layer 8, and a p-type GaAs contact layer 9 are formed on an n-type GaAs substrate 1 by organometallic vapor phase epitaxy. Similar to the concrete example I, the compositions of the first cladding layer 2, the second cladding layer 8, the first optical waveguide layer 3, and the second optical waveguide layer 7 are determined so as to lattice-match with the GaAs substrate 1. In addition, although not shown, the p-type $Ga_{1-z1}Al_{z1}As$ second cladding layer 8 may include at its mid-thickness a p-type InGaP etching stop layer having a thickness of about 10 nm.

In the concrete example II, the end of the electric-to-optical conversion layer 5 and the ends of the first and second barrier layers 4 and 6 protrude outward from the ends of the first and second optical waveguide layers 3 and 7 and the ends of the first and second cladding layers 2 and 8, as illustrated in FIG. 2F. This edge structure can be realized by etching of the end facets of the semiconductor layers when chlorine ($Cl_2$) and argon (Ar) are used, and the mixture ratio of chlorine ($Cl_2$) and argon (Ar) is appropriately adjusted. Alternatively, the above edge structure can be realized by etching using hydrochloric acid, a solution of sulfuric acid and hydrogen peroxide, tartaric acid, or the like.

In addition, the protection films may be made of an oxide material such as $SiO_2$, $Ta_2O_5$, or $TiO_2$, a group IV semiconductor material such as Ge, Si, or C, a metal material such as Al, Ta, or Cr, or a nitride material such as $SiN_x$, $AlN_x$, $GaN_x$, or $CN_x$.

What is claimed is:

1. A semiconductor laser device comprising a stack of a plurality of semiconductor layers which include:

a substrate;

a first cladding layer of a first conductive type, formed above said substrate;

an electric-to-optical conversion layer formed above said first cladding layer; and a second cladding layer of a second conductive type, formed above said electric-to-optical conversion layer;

wherein resonator surfaces are formed at opposite ends of said stack, and wherein an end of said electric-to-optical conversion layer at at least one of the opposite ends of said stack protrudes outward from a shortest current path between end facets of said first cladding layer and said second cladding layer at said at least one of the opposite ends of said stack through semiconductor layers located between the first cladding layer and the second cladding layer.

2. A semiconductor laser device according to claim 1, further comprising at least one protection film with which at least one of said resonator surfaces at said at least one of the opposite ends of said stack is coated.

3. A semiconductor laser device according to claim 1, wherein said plurality of semiconductor layers further include, a first optical waveguide layer formed between said first cladding layer and said electric-to-optical conversion layer, a second optical waveguide layer formed between said second cladding layer and said electric-to-optical conversion layer, and a contact layer formed above said second cladding layer.

4. A semiconductor laser device according to claim 3, wherein said end of said electric-to-optical conversion layer at said each of the at least one of the opposite ends of said stack protrudes outward from said end facets of said first optical waveguide layer and said second optical waveguide layer at said each of the at least one of the opposite ends of said stack.

5. A semiconductor laser device according to claim 4, wherein said end of said electric-to-optical conversion layer and end facets of said first and second optical waveguide layers at said each of the at least one of the opposite ends of said stack protrude outward from said end facets of said first cladding layer and said second cladding layer at said each of the at least one of the opposite ends of said stack.

6. A semiconductor laser device according to claim 3, wherein said plurality of semiconductor layers further include, a first barrier layer formed between said first optical waveguide layer and said electric-to-optical conversion layer, and a second barrier layer formed between said second optical waveguide layer and said electric-to-optical conversion layer.

7. A semiconductor laser device according to claim 6, wherein said end of said electric-to-optical conversion layer at said each of the at least one of the opposite ends of said stack protrudes outward from end facets of said first and second barrier layers at said each of the at least one of the opposite ends of said stack.

8. A semiconductor laser device according to claim 6, wherein said end of said electric-to-optical conversion layer and end facets of said first and second barrier layers at said each of the at least one of the opposite ends of said stack protrude outward from end facets of said first and second optical waveguide layers at said each of the at least one of the opposite ends of said stack.

9. A semiconductor laser device according to claim 6, wherein said end of said electric-to-optical conversion layer, end facets of said first and second baffler layers, and end facets of said first and second optical waveguide layers at said each of the at least one of the opposite ends of said stack protrude outward from said end facets of said first cladding layer and said second cladding layer at said each of the at least one of the opposite ends of said stack.

10. A semiconductor laser device according to claim 3, wherein said end of said electric-to-optical conversion layer at said each of the at least one of the opposite ends of said stack protrudes outward from the end of one of said first cladding layer and said second cladding layer at said each of the at least one of the opposite ends of said stack, and is recessed from the end of the other of said first cladding layer and said second cladding layer at said each of the at least one of the opposite ends of said stack.

11. A semiconductor laser device according to claim 2, wherein at least one first semiconductor layer out of said plurality of semiconductor layers has an end recessed from said end of said electric-to-optical conversion layer at said each of said at least one of the opposite ends of said stack, at least one second semiconductor layer out of said at least one first semiconductor layer is located nearest to the electric-to-optical conversion layer among said at least one first semiconductor layer, one of said at least one second semiconductor layer has an end recessed from said end of said electric-to-optical conversion layer by the smallest amount of recession among said at least one second semiconductor layer, and said smallest amount of recession satisfies a condition $a \leq \Delta D \leq \delta$, where a is a lattice constant of said electric-to-optical conversion layer, $\delta$ is a thickness of one of the at least one protection film at said each of said at least one of the opposite ends of said stack, and $\Delta D$ is said smallest amount of recession.

12. A semiconductor laser device according to claim 11, wherein said at least one first semiconductor layer includes more than one semiconductor layer, two semiconductor layers out of said more than one semiconductor layer are located nearest to the electric-to-optical conversion layer among the more than one semiconductor layer, one of the two semiconductor layers has an end recessed from the end of the electric-to-optical conversion layer by the larger amount of recession between the two semiconductor layers, and the larger amount of recession may satisfy a condition $a \leq \Delta D \leq \delta/k$, where $k = \Delta d/\Delta D$, and $\Delta d$ is the larger amount of recession.

13. A semiconductor laser device comprising a stack of a plurality of semiconductor layers which include:

a substrate;

a first cladding layer of a first conductive type, formed above said substrate;

an electric-to-optical conversion layer formed above said first cladding layer; and a second cladding layer of a second conductive type, formed above said electric-to-optical conversion layer;

wherein resonator surfaces are formed at opposite ends of said stack, said ends are located perpendicular to a thickness direction of said stack, and wherein an end of said electric-to-optical conversion layer at at least one of the opposite ends of said stack protrudes outward from a shortest current path between end facets of said first cladding layer and said second cladding layer at said at least one of the opposite ends of said stack through semiconductor layers located between the first cladding layer and the second cladding layer.

* * * * *